United States Patent
Guyette et al.

(10) Patent No.: US 11,996,825 B2
(45) Date of Patent: *May 28, 2024

(54) FILTER USING LITHIUM NIOBATE AND ROTATED LITHIUM TANTALATE TRANSVERSELY-EXCITED FILM BULK ACOUSTIC RESONATORS

(71) Applicant: Murata Manufacturing Co., Ltd., Nagaokakyo (JP)

(72) Inventors: Andrew Guyette, San Mateo, CA (US); Neal Fenzi, Santa Barbara, CA (US); Bryant Garcia, Burlingame, CA (US)

(73) Assignee: Murata Manufacturing Co., Ltd., Nagaokakyo (JP)

(*) Notice: Subject to any disclaimer, the term of this patent is extended or adjusted under 35 U.S.C. 154(b) by 672 days.

This patent is subject to a terminal disclaimer.

(21) Appl. No.: 17/133,857

(22) Filed: Dec. 24, 2020

(65) Prior Publication Data

US 2021/0399717 A1  Dec. 23, 2021

Related U.S. Application Data

(63) Continuation-in-part of application No. 17/070,694, filed on Oct. 14, 2020, now Pat. No. 11,329,628.

(Continued)

(51) Int. Cl.
*H03H 9/56* (2006.01)
*H03H 3/02* (2006.01)
(Continued)

(52) U.S. Cl.
CPC ............ *H03H 9/562* (2013.01); *H03H 3/02* (2013.01); *H03H 9/02031* (2013.01);
(Continued)

(58) Field of Classification Search
CPC ...... H03H 9/562; H03H 3/02; H03H 9/02031; H03H 9/02228; H03H 9/174; H03H 9/176;
(Continued)

(56) References Cited

U.S. PATENT DOCUMENTS 5,631,515 A   5/1997   Mineyoshi et al.
5,853,601 A   12/1998  Krishaswamy et al.
(Continued)

FOREIGN PATENT DOCUMENTS

CN   106788318 A   5/2017
CN   110417373 A   11/2019
(Continued)

OTHER PUBLICATIONS

International Search Report and Written Opinion in PCT/US2022/081068, dated Apr. 18, 2023, 17 pages.
(Continued)

*Primary Examiner* — Rakesh B Patel
*Assistant Examiner* — Jorge L Salazar, Jr.
(74) *Attorney, Agent, or Firm* — ArentFox Schiff LLP

(57) ABSTRACT

Acoustic filters are disclosed. A bandpass filter has a passband between a lower band edge and an upper band edge. The bandpass filter includes a plurality of transversely-excited film bulk acoustic resonators (XBARs) connected in a ladder filter circuit. The plurality of XBARs includes at least one lithium tantalate (LT) XBAR and at least one lithium niobate XBAR. Each of the at least one LT XBAR includes an LT piezoelectric plate with Euler angles (0°, β, 0°), where β is greater than zero and less than or equal to 40 degrees.

20 Claims, 17 Drawing Sheets

Related U.S. Application Data

(60) Provisional application No. 63/088,344, filed on Oct. 6, 2020, provisional application No. 63/040,440, filed on Jun. 17, 2020.

(51) Int. Cl.
*H03H 9/02* (2006.01)
*H03H 9/17* (2006.01)

(52) U.S. Cl.
CPC ........ *H03H 9/02228* (2013.01); *H03H 9/174* (2013.01); *H03H 9/176* (2013.01); *H03H 9/564* (2013.01); *H03H 9/568* (2013.01); *H03H 2003/023* (2013.01)

(58) Field of Classification Search
CPC .. H03H 9/564; H03H 9/568; H03H 2003/023; H03H 9/02015; H03H 9/588; H03H 9/605
USPC ......................................... 333/186, 187, 188
See application file for complete search history.

(56) References Cited

U.S. PATENT DOCUMENTS

| | | | |
|---|---|---|---|
| 6,540,827 B1 | 4/2003 | Levy et al. | |
| 6,570,470 B2 | 5/2003 | Maehara et al. | |
| 6,670,866 B2 | 12/2003 | Ella et al. | |
| 6,707,229 B1 | 3/2004 | Martin | |
| 7,463,118 B2 | 12/2008 | Jacobsen | |
| 7,535,152 B2 | 5/2009 | Ogami et al. | |
| 7,554,427 B2 | 6/2009 | Matsumoto | |
| 7,684,109 B2 | 3/2010 | Godshalk et al. | |
| 7,868,519 B2 | 1/2011 | Umeda | |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,154,111 B2 | 10/2015 | Bradley | |
| 9,219,466 B2 | 12/2015 | Meltaus et al. | |
| 9,240,768 B2 | 1/2016 | Nishihara et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,389,391 B2 | 8/2019 | Ito | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,819,319 B1 | 10/2020 | Hyde | |
| 10,826,462 B2 | 11/2020 | Plesski et al. | |
| 10,868,510 B2 | 12/2020 | Yantchev | |
| 11,323,089 B2 | 5/2022 | Turner | |
| 11,329,628 B2 * | 5/2022 | Guyette ............. | H03H 9/02015 |
| 11,368,139 B2 | 6/2022 | Garcia | |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0041496 A1 | 3/2004 | Imai et al. | |
| 2004/0207033 A1 | 10/2004 | Koshido | |
| 2004/0207485 A1 | 10/2004 | Kawachi et al. | |
| 2004/0261250 A1 | 12/2004 | Kadota et al. | |
| 2005/0099091 A1 | 5/2005 | Mishima | |
| 2006/0131731 A1 | 6/2006 | Sato | |
| 2006/0152107 A1 | 7/2006 | Tanaka | |
| 2007/0090898 A1 | 4/2007 | Kando et al. | |
| 2007/0115079 A1 | 5/2007 | Kubo et al. | |
| 2007/0188047 A1 | 8/2007 | Tanaka | |
| 2007/0194863 A1 | 8/2007 | Shibata et al. | |
| 2007/0278898 A1 | 12/2007 | Miura et al. | |
| 2008/0018414 A1 | 1/2008 | Inoue et al. | |
| 2008/0297280 A1 | 12/2008 | Thalhammer | |
| 2009/0273415 A1 | 11/2009 | Frank | |
| 2009/0315640 A1 | 12/2009 | Umeda et al. | |
| 2010/0064492 A1 | 3/2010 | Tanaka | |
| 2010/0123367 A1 | 5/2010 | Tai et al. | |
| 2010/0223999 A1 | 9/2010 | Onoe | |
| 2010/0301703 A1 | 12/2010 | Chen et al. | |
| 2011/0102107 A1 | 5/2011 | Onzuka | |
| 2011/0109196 A1 | 5/2011 | Goto | |
| 2011/0278993 A1 | 11/2011 | Iwamoto | |
| 2013/0057360 A1 | 3/2013 | Meltaus et al. | |
| 2013/0234805 A1 | 9/2013 | Takahashi | |
| 2013/0321100 A1 | 12/2013 | Wang | |
| 2014/0009032 A1 | 1/2014 | Takahashi et al. | |
| 2014/0009247 A1 | 1/2014 | Moriya | |
| 2014/0113571 A1 | 4/2014 | Fujiwara et al. | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0312994 A1 | 10/2014 | Meltaus et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0049920 A1 | 2/2016 | Kishino | |
| 2016/0182009 A1 | 6/2016 | Bhattacharjee | |
| 2016/0285430 A1 | 9/2016 | Kikuchi et al. | |
| 2016/0301382 A1 | 10/2016 | Iwamoto | |
| 2017/0063332 A1 | 3/2017 | Gilbert et al. | |
| 2017/0104470 A1 | 4/2017 | Koelle et al. | |
| 2017/0179928 A1 | 6/2017 | Raihn et al. | |
| 2017/0187352 A1 | 6/2017 | Omura | |
| 2017/0214387 A1 | 7/2017 | Burak et al. | |
| 2017/0222622 A1 | 8/2017 | Solal et al. | |
| 2017/0264266 A1 | 9/2017 | Kishimoto | |
| 2017/0290160 A1 | 10/2017 | Takano et al. | |
| 2017/0370791 A1 | 12/2017 | Nakamura et al. | |
| 2018/0013405 A1 | 1/2018 | Takata | |
| 2018/0123016 A1 | 5/2018 | Gong et al. | |
| 2018/0191322 A1 | 7/2018 | Chang et al. | |
| 2019/0007022 A1 | 1/2019 | Goto et al. | |
| 2019/0068155 A1 | 2/2019 | Kimura | |
| 2019/0068164 A1 | 2/2019 | Houlden et al. | |
| 2019/0131953 A1 | 5/2019 | Gong | |
| 2019/0148621 A1 | 5/2019 | Feldman et al. | |
| 2019/0181825 A1 | 6/2019 | Schmalzl et al. | |
| 2019/0181833 A1 | 6/2019 | Nosaka | |
| 2019/0207583 A1 | 7/2019 | Miura et al. | |
| 2019/0245518 A1 | 8/2019 | Ito | |
| 2019/0273480 A1 | 9/2019 | Lin | |
| 2019/0386638 A1 | 12/2019 | Kimura et al. | |
| 2020/0007110 A1 | 1/2020 | Konaka et al. | |
| 2020/0228087 A1 | 7/2020 | Michigami et al. | |
| 2020/0244247 A1 | 7/2020 | Maeda | |
| 2021/0036679 A1 * | 2/2021 | Kishino ............. | H03H 9/02543 |
| 2021/0273631 A1 | 9/2021 | Jachowski et al. | |
| 2022/0103160 A1 | 3/2022 | Jachowski et al. | |
| 2022/0149808 A1 | 5/2022 | Dyer et al. | |
| 2022/0200567 A1 | 6/2022 | Garcia | |

FOREIGN PATENT DOCUMENTS

| | | |
|---|---|---|
| CN | 210431367 U | 4/2020 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2007329584 A | 12/2007 |
| JP | 2010062816 A | 3/2010 |
| JP | 2010233210 A | 10/2010 |
| JP | 2013528996 A | 7/2013 |

(56) References Cited

FOREIGN PATENT DOCUMENTS

| JP | 2015054986 A | 3/2015 |
|---|---|---|
| JP | 2016001923 A | 1/2016 |
| JP | 2018166259 A | 10/2018 |
| JP | 2018207144 A | 12/2018 |
| JP | 2020113939 A | 7/2020 |
| WO | 2015098694 A1 | 7/2015 |
| WO | 2016017104 | 2/2016 |
| WO | 2016052129 A1 | 7/2016 |
| WO | 2016147687 A1 | 9/2016 |
| WO | 2018003268 A1 | 1/2018 |
| WO | 2018003273 A1 | 1/2018 |
| WO | 2018163860 A1 | 9/2018 |

OTHER PUBLICATIONS

Office Action in JP2021175220, dated Apr. 25, 2023, 10 pages.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHz Lithium Niobate MEMS Resonators With High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A.. (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Webster Dictionary Meaning of "diaphragm" Merriam Webster since 1828.
Safari et al."Piezoelectric for Transducer Applications" published by Elsevier Science Ltd., pp. 4 (Year: 2000).
Moussa et al. Review on Triggered Liposomal Drug Delivery with a Focus on Ultrasound2015, Bentham Science Publishers, pp. 16 (Year 2005).
Acoustic Properties of SolidsONDA Corporation592 Weddell Drive, Sunnyvale, CA 94089, Apr. 11, 2003, pp. 5 (Year 2003).
Bahreynl, B.Fabrication and Design of Resonant MicrodevicesAndrew William, Inc. 2018, NY (Year 2008).
Material Properties of Tibtech Innovations, © 2018 TIBTECH Innovations (Year 2018).
Gorisse et al., "Lateral Field Excitation of membrane-based Aluminum Nitride resonators," Joint Conference of the IEEE International Frequency Control and the European Frequency and Time Forum (FCS), May 2011, 5 pages.
Pang et al., "Self-Aligned Lateral Field Excitation Film Acoustic Resonator with Very Large Electromechanical Coupling," IEEE International Ultrasonics, Ferroelectrics, and Frequency Control Joint 50th Anniversary Conference, Aug. 2004, pp. 558-561.
Yandrapalli et al., "Toward Band n78 Shear Bulk Acoustic Resonators Using Crystalline Y-Cut Lithium Niobate Films With Spurious Suppression," Journal of Microelectromechanical System, Aug. 2023, vol. 32, No. 4, pp. 327-334.

* cited by examiner

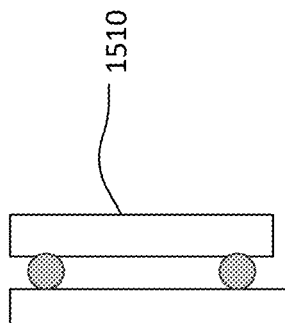
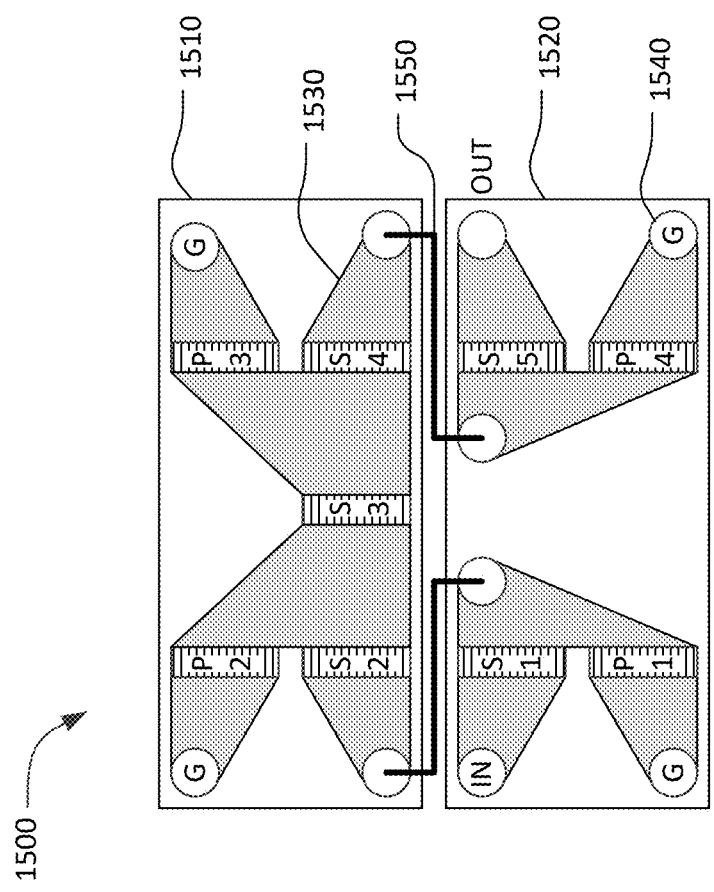
FIG. 15B
FIG. 15A

FILTER USING LITHIUM NIOBATE AND ROTATED LITHIUM TANTALATE TRANSVERSELY-EXCITED FILM BULK ACOUSTIC RESONATORS

RELATED APPLICATION INFORMATION

This patent claims priority from provisional patent application 63/088,344, filed Oct. 6, 2020, titled OPTIMAL CUT ANGLE TO REDUCE TCF OF XBAR FILTERS. This patent is a continuation-in-part of application Ser. No. 17/070,694, filed Oct. 14, 2020, entitled FILTER USING LITHIUM NIOBATE AND LITHIUM TANTALATE TRANSVERSELY-EXCITED FILM BULK ACOUSTIC RESONATORS, which claims priority to provisional patent application 63/040,440, filed Jun. 17, 2020, titled FILTER USING LITHIUM NIOBATE AND LITHIUM TANTALATE XBARS. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

DESCRIPTION OF THE DRAWINGS

FIG. 15A is a schematic plan view of a filter using lithium niobate and lithium tantalate XBARs.

FIG. 15B is a schematic side view of the filter using lithium niobate and lithium tantalate XBARs of FIG. 15A.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
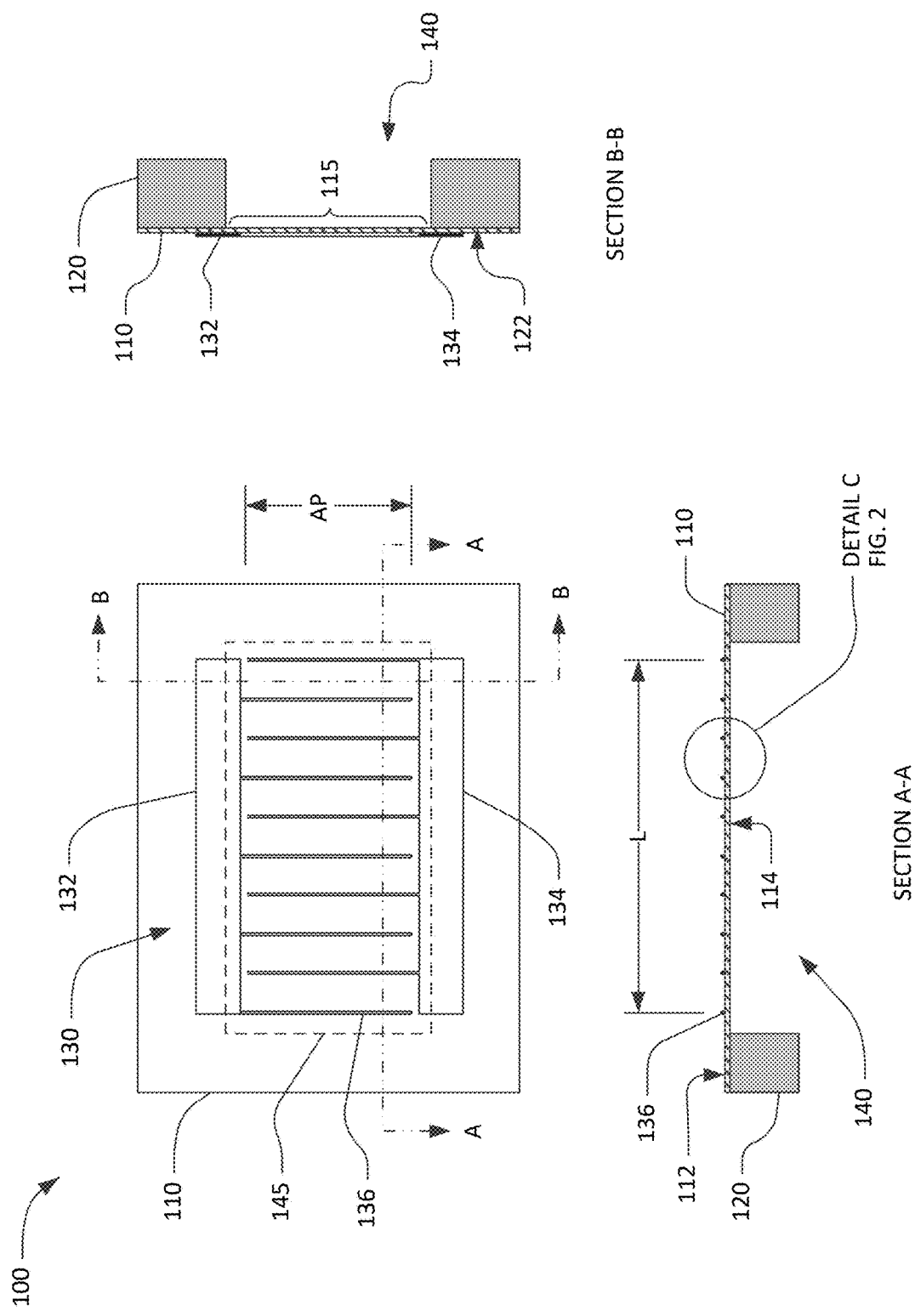
FIG. 1 is a schematic plan view and two schematic cross-sectional views of a transversely-excited film bulk acoustic resonator (XBAR).

Transversely-excited film bulk acoustic resonators (XBARs) were initially described in U.S. Pat. No. 10,491,192. FIG. 1 shows a simplified schematic top view and orthogonal cross-sectional views of an XBAR 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 is made up of a thin film conductor pattern formed on a surface of a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front surface 112 and back surface 114. However, XBARs may be fabricated on piezoelectric plates with other crystallographic orientations including rotated Z-cut and rotated YX-cut.

The back surface 114 of the piezoelectric plate 110 is attached to a surface 122 of the substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each busbar 132, 134 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 110. An XBAR may have hundreds, possibly thousands, of parallel fingers in the IDT 110. Similarly, the thickness of the fingers in the cross-sectional views is greatly exaggerated in the drawings.

Figure 2:
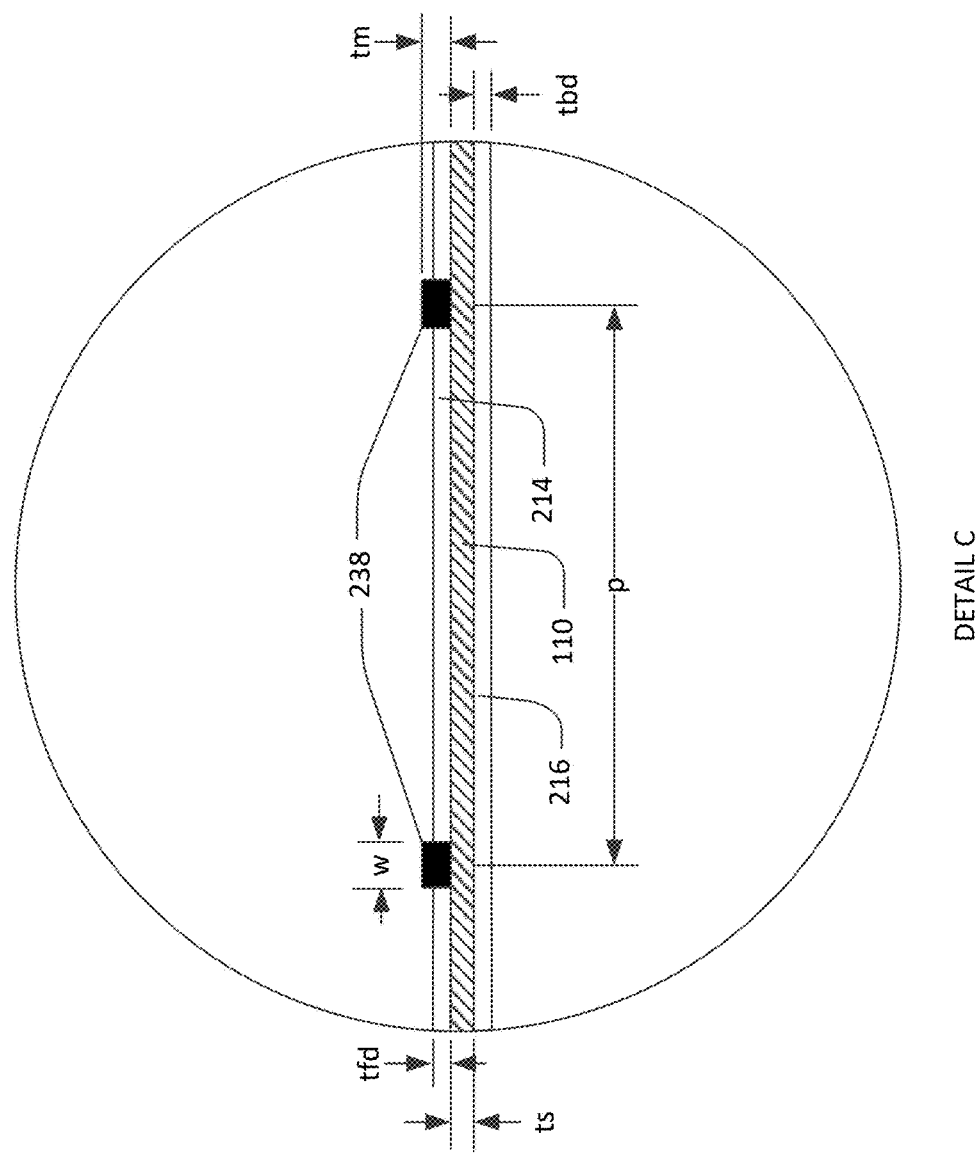
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be one or more layers of aluminum, a substantially aluminum alloy, copper, a substantially copper alloy, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. As shown in FIG. 2, the IDT fingers 238 have rectangular cross-sections. The IDT fingers may have some other cross-sectional shape, such as trapezoidal.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
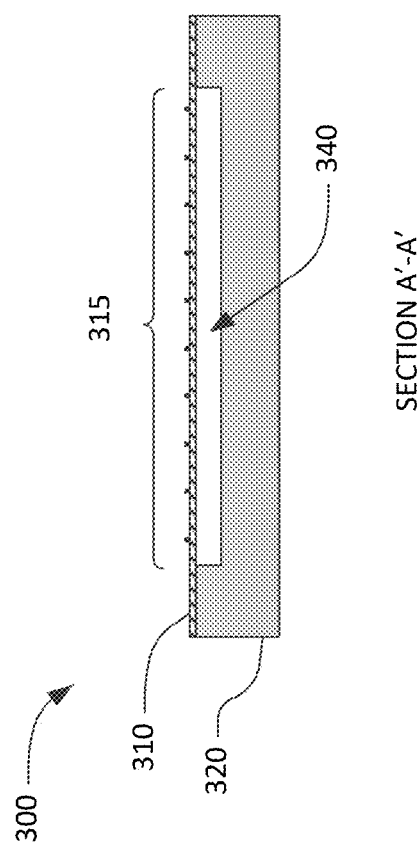
FIG. 3 is an alternative schematic cross-sectional view of the XBAR of FIG. 1.

FIG. 3 is an alternative cross-sectional view along the section plane A-A defined in FIG. 1. In FIG. 3, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340.

Figure 4:
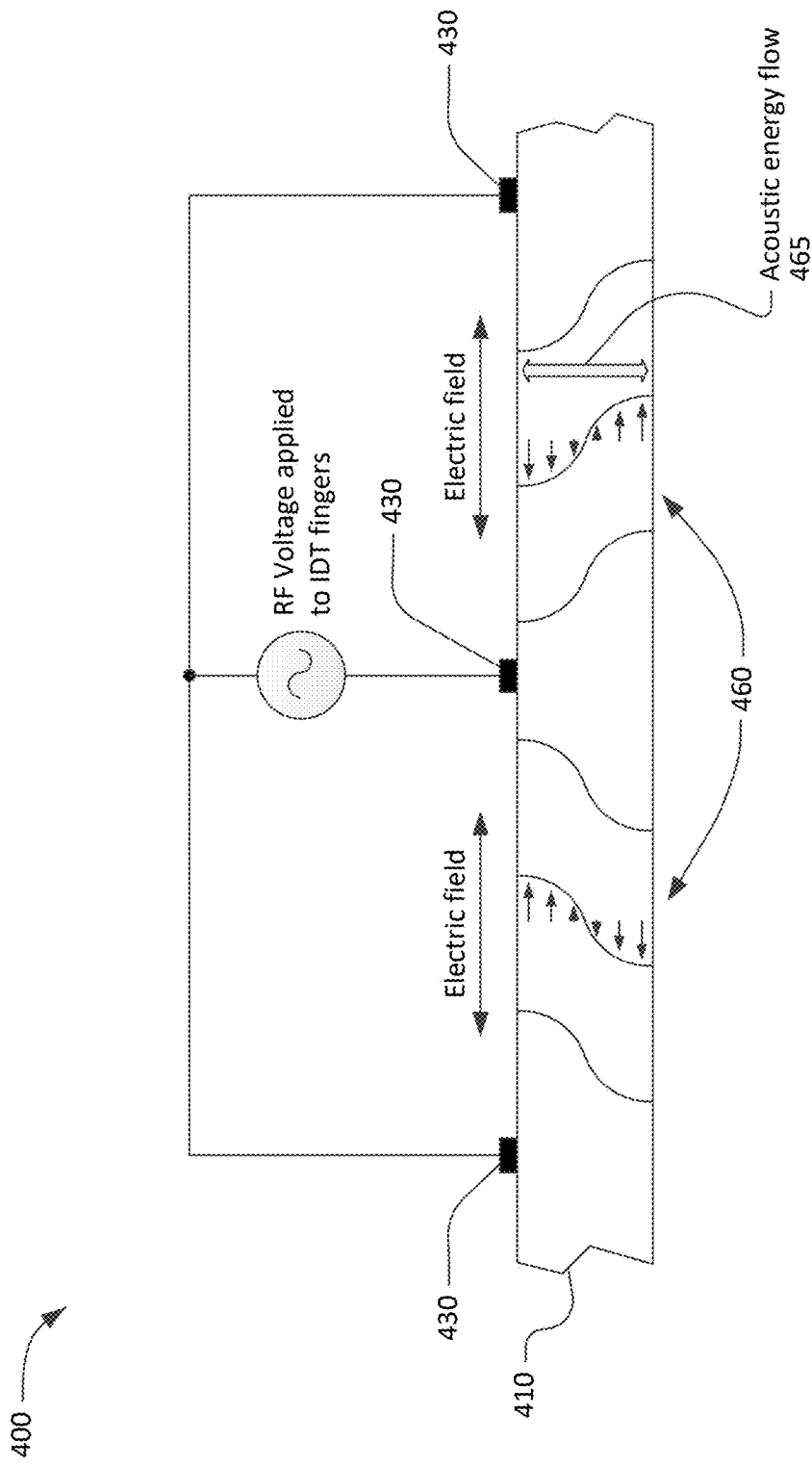
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
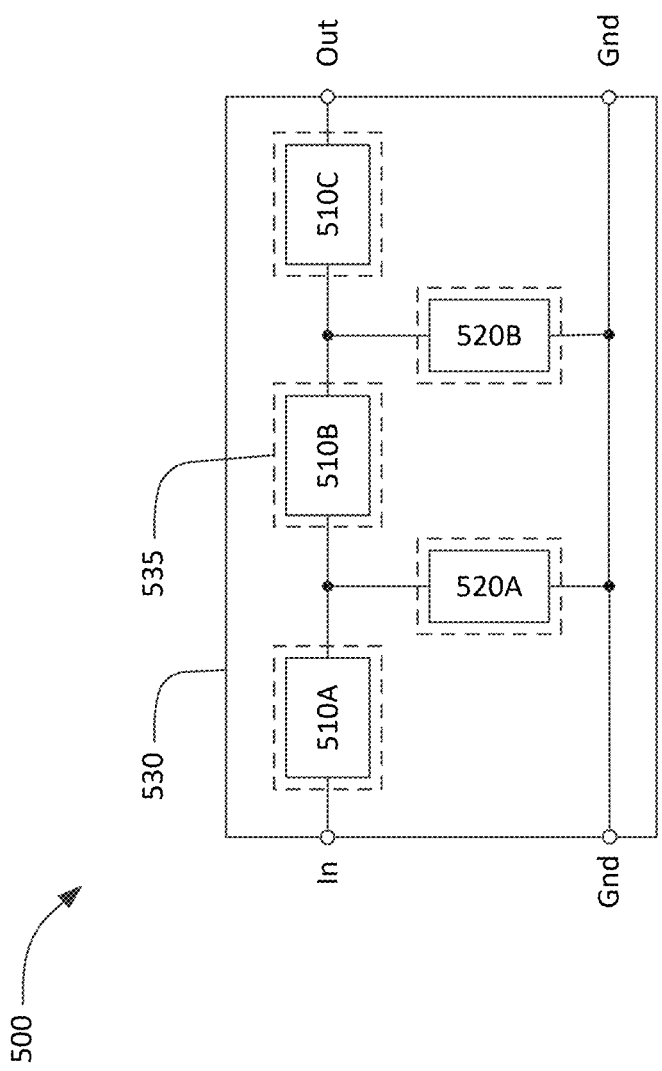
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Figure 6:
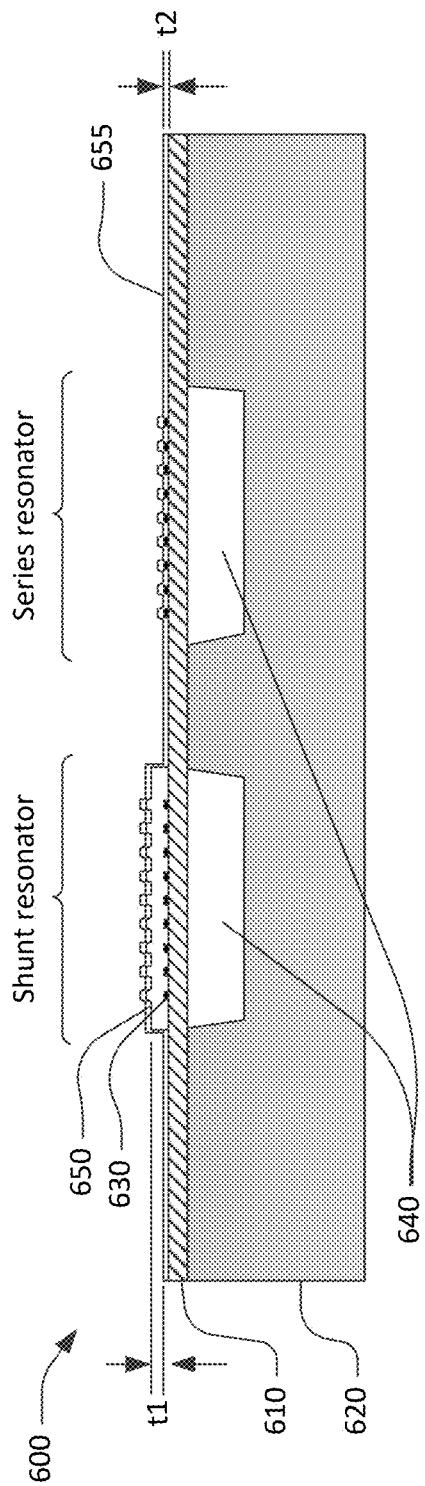
FIG. 6 is a schematic cross-sectional view of two XBARs illustrating a frequency-setting dielectric layer.

FIG. 6 is a schematic cross-sectional view through a shunt resonator and a series resonator of a filter 600 that uses a dielectric frequency setting layer to separate the resonance frequencies of shunt and series resonators. A piezoelectric plate 610 is attached to a substrate 620. Portions of the piezoelectric plate 610 form diaphragms spanning cavities 640 in the substrate 620. Interleaved IDT fingers, such as finger 630, are formed on the diaphragms. A first dielectric layer 650, having a thickness t1, is formed over the IDT of the shunt resonator. The first dielectric layer 650 is considered a "frequency setting layer", which is a layer of dielectric material applied to a first subset of the resonators in a filter to offset the resonance frequencies of the first subset of resonators with respect to the resonance frequencies of resonators that do not receive the dielectric frequency setting layer. The dielectric frequency setting layer is commonly $SiO_2$ but may be silicon nitride, aluminum oxide, or some other dielectric material. The dielectric frequency setting layer may be a laminate or composite of two or more dielectric materials.

A second dielectric layer 655, having a thickness t2, may be deposited over both the shunt and series resonator. The second dielectric layer 655 serves to seal and passivate the surface of the filter 600. The second dielectric layer may be the same material as the first dielectric layer or a different material. The second dielectric layer may be a laminate or composite of two or more different dielectric materials. Further, as will be described subsequently, the thickness of the second dielectric layer may be locally adjusted to fine-tune the frequency of the filter 600A. Thus, the second dielectric layer can be referred to as the "passivation and tuning layer".

The resonance frequency of an XBAR is roughly proportional to the inverse of the total thickness of the diaphragm including the piezoelectric plate 610 and the dielectric layers 650, 655. The diaphragm of the shunt resonator is thicker than the diaphragm of the series resonator by the thickness t1 of the dielectric frequency setting layer 650. Thus, the shunt resonator will have a lower resonance frequency than the series resonator. The difference in resonance frequency between series and shunt resonators is determined by the thickness t1.

Lithium niobate and lithium tantalate are preferred piezoelectric materials for use in XBARs. The term "lithium niobate XBAR" means an XBAR with a lithium niobate diaphragm. Similarly, the term "lithium tantalate XBAR" means an XBAR with a lithium tantalate diaphragm. Lithium niobate XBARs have very high electromechanical coupling, which results in a large difference between the resonance and anti-resonance frequencies of a lithium niobate XBAR. Lithium niobate XBARs are suitable for use in bandpass filters for ultra-wide communications bands such as band N77 (3400 to 4300 MHz) and band N79 (4400 to 5000 MHz). However, lithium niobate has a temperature coefficient of frequency (TCF) of about −80 to ~100 ppm/C° (parts per million per degree Celsius). The passband of filters using lithium niobate XBARs may shift in frequency by more than 1% over the operating temperature range of a communications device.

Lithium tantalate XBARs have lower electromechanical coupling than lithium niobate XBARs, which results in a smaller difference between the resonance and anti-resonance frequencies of a lithium tantalate XBAR. It is not practical to design filters for band N77 or band N79 using only lithium tantalate XBARs. However, the TCF of lithium tantalate XBARs is roughly half of the TCF of lithium niobate XBARs. Typically, the TCF of lithium niobate is about 80 ppm per degree Celsius; the TCF of lithium niobate is about 40 ppm per degree Celsius.

Using both lithium niobate XBARs and lithium tantalate XBARs in the same filter provides for the best features of each technology. Such filters can have the wide bandwidth enabled by the large electromechanical coupling of lithium niobate XBARs and the low TCF of lithium tantalate XBARs.

Figure 7:
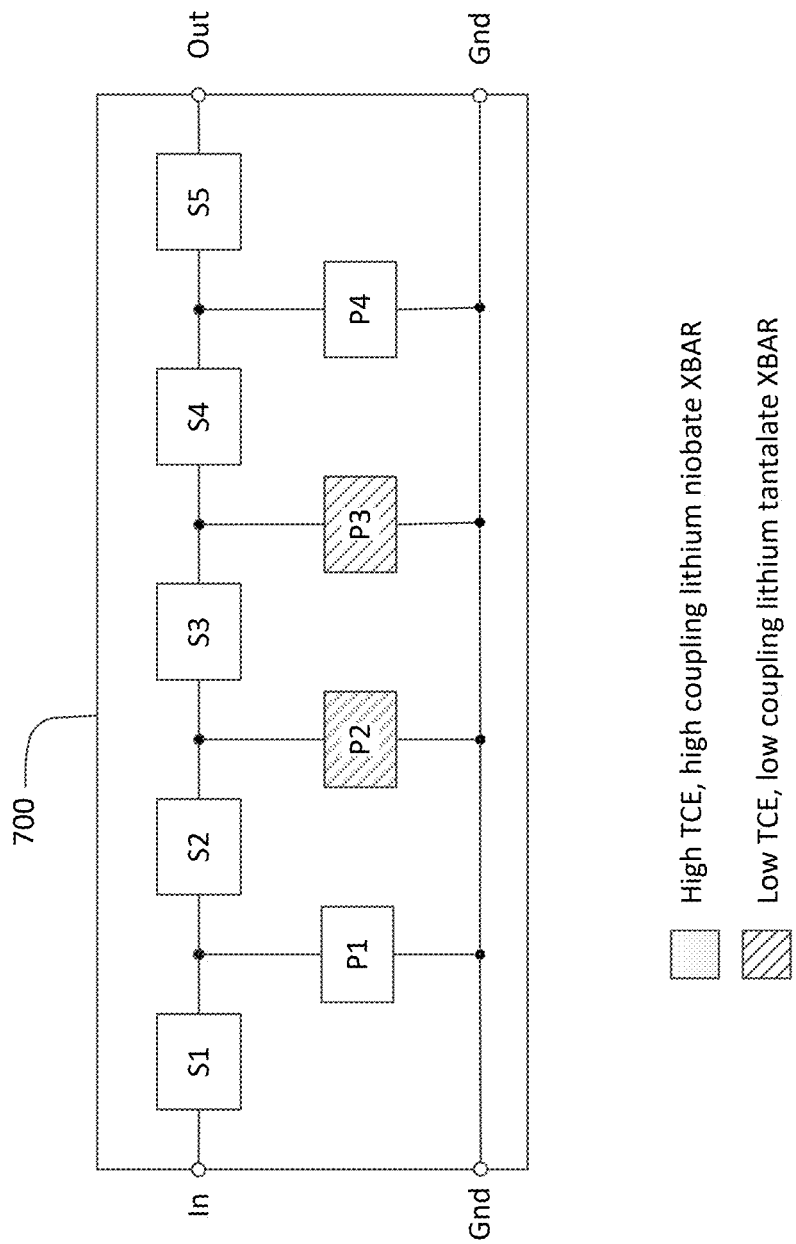
FIG. 7 is a schematic diagram of a filter using lithium niobate and lithium tantalate XBARs.

FIG. 7 is a schematic diagram of a bandpass filter 700 that takes advantage of the features of both lithium niobate and lithium tantalate XBARs. The filter 700 includes five series resonators S1, S2, S3, S4, and S5 and four shunt resonators P1, P2, P3, and P4 connected in ladder filter circuit. Shunt resonators P2 and P3 are lithium tantalate XBARs. The other resonators are lithium niobate XBARs. The rationale for this design can be appreciated upon consideration of FIG. 8.

Figure 8:
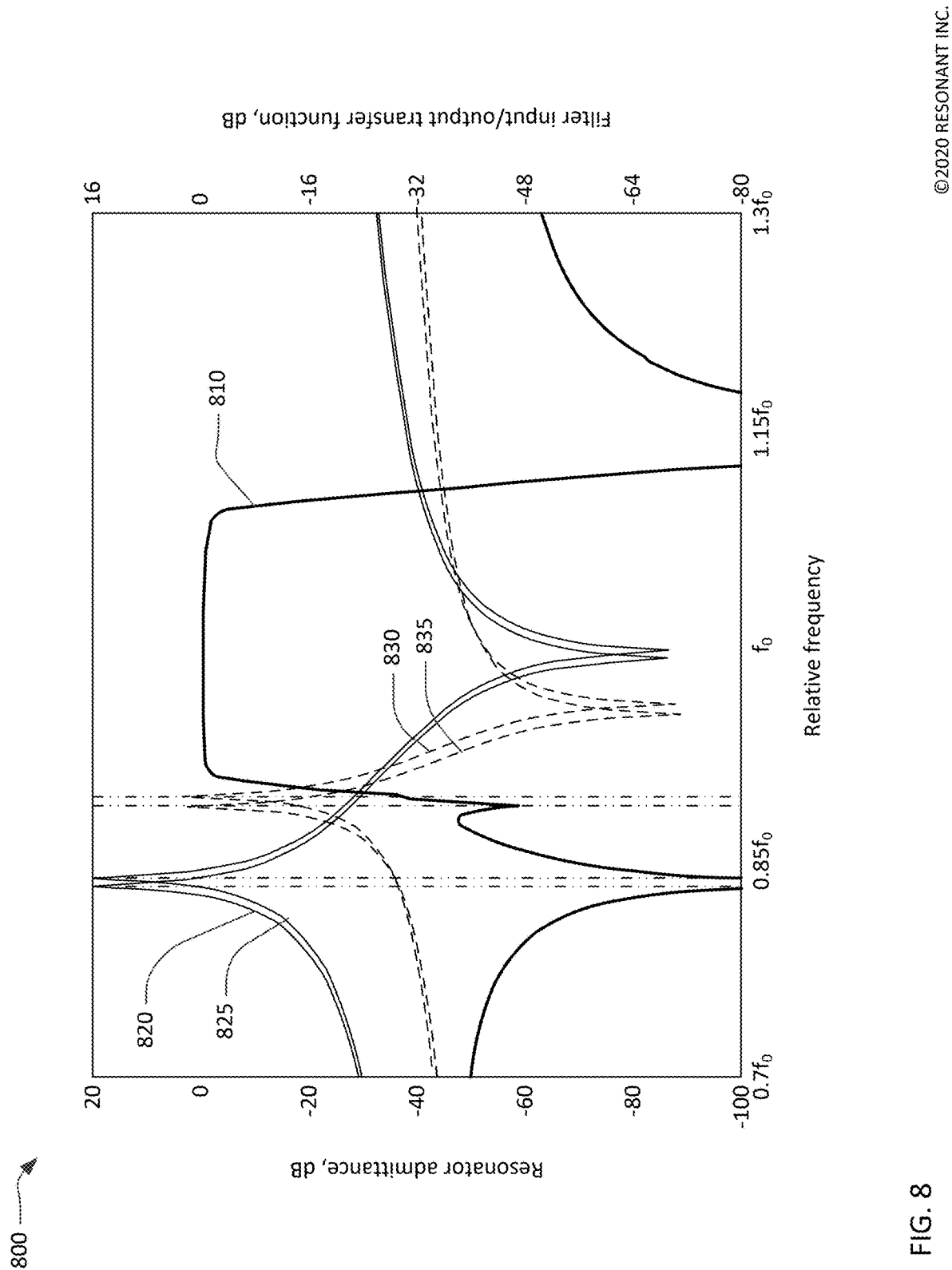
FIG. 8 is a graph of the input/output transfer function of the filter of FIG. 7 and the admittances of four shunt resonators from the filter of FIG. 7.

FIG. 8 is a graph of the input/output transfer function of the bandpass filter 700 and the admittances of the four shunt resonators P1, P2, P3, P4 within the filter 700. The data in FIG. 7 and subsequent figures is based on simulation of XBAR filters using a finite element method. Specifically, the bold curve 810 is the input/output transfer function of the filter 700, which is read using the right-hand vertical scale. The solid curves 820, 825 are the admittances of resonators P1 and P4, which are lithium niobate XBARs. The dashed curves 830, 835 are the admittances of resonators P2 and P3, which are lithium tantalate XBARs. Curves 820, 825, 830, 835 are read using the left-hand vertical scale.

As previously explained, the input-output transfer function of a filter will be near zero at the resonance frequencies of the shunt resonators and at the anti-resonance frequencies of the series resonators. In other words, each shunt resonator creates a "transmission zero" at its resonance frequency. Shunt resonators P2 and P3 (dashed curves 830, 835) create transmission zeros proximate the lower edge of the filter passband. In particular, the resonator represented by the dashed curve 830 (it does not matter whether this is P2 or P3) creates a transmission zero immediately adjacent to the lower edge of the passband. "Immediately adjacent" means "adjacent with nothing else (i.e. no other transmission zero) intervening". This resonator defines, or sets, the lower edge of the passband. Typically, a single shunt resonator defines the lower edge of a filter's passband and a single series resonator defines the upper edge of the passband. In some cases, two or more resonators may create transmission zeros at the same frequency and jointly define the upper or lower band edge.

For the filter 700, the TCF of the lower edge of the passband will be approximately equal to the TCF of the resonator that defines the lower band edge (i.e. the resonator that creates the transmission zero immediately adjacent to the band edge). Since resonators P2 and P3 are lithium tantalate XBARs, the TCF of the lower edge of the passband will be about equal to the TCF of lithium tantalate. The benefit of using a lithium tantalate XBAR to define the lower edge of the passband is illustrated in FIG. 9.

Figure 9:
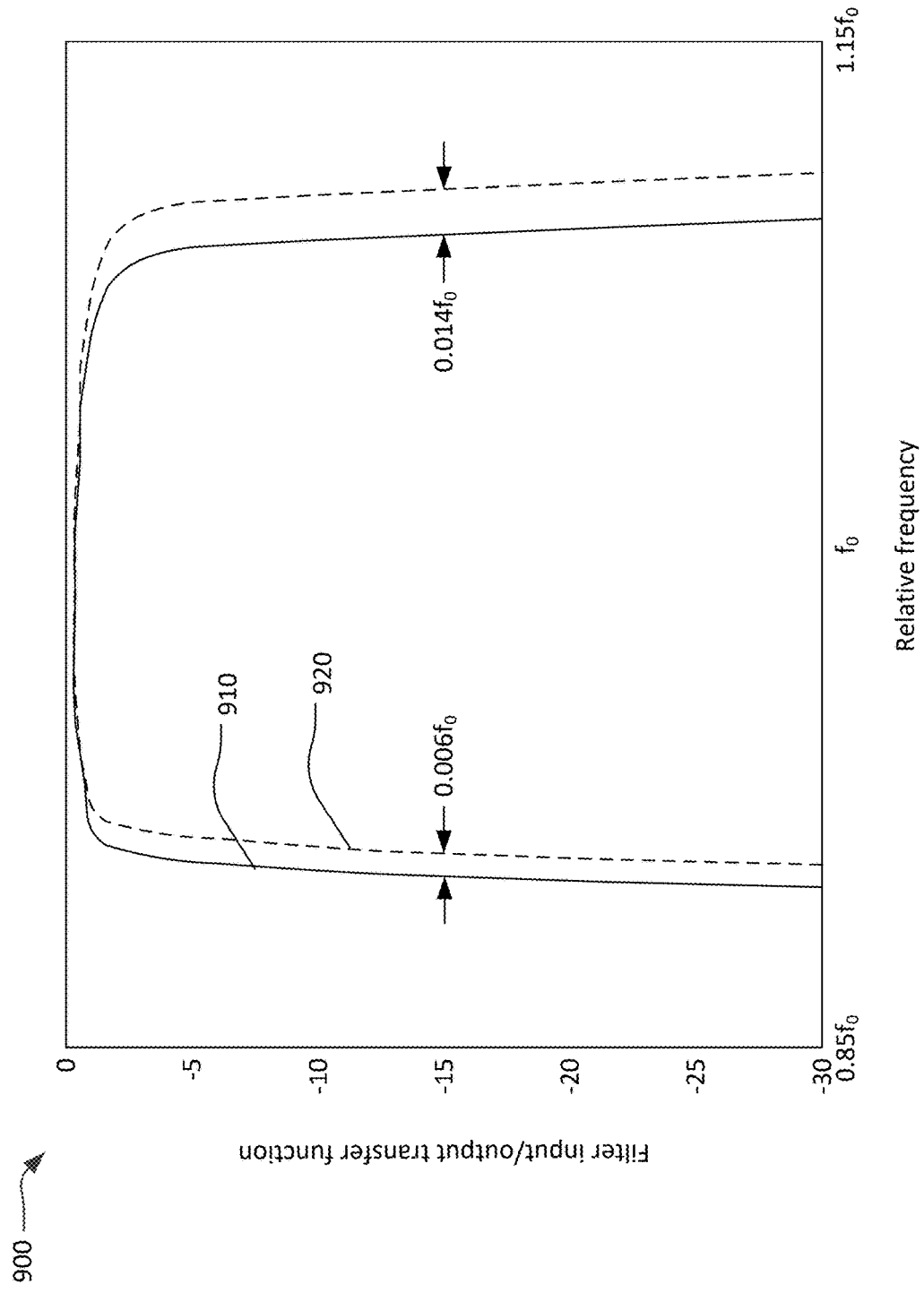
FIG. 9 is a graph of the input/output transfer function of the filter of FIG. 7 at two temperatures.

FIG. 9 is a graph 900 of the input/output transfer function of the filter 700 of FIG. 7 at two widely separated temperatures. Specifically, the solid curve 910 is a plot of the input/output transfer function of the filter 700 at a high temperature. The dashed curve 920 is a plot of the input/output transfer function of the filter 700 at a low temperature. The difference between the high and low temperatures is 115 degrees Celsius. The lower edge of the passband, which is defined by lithium tantalate XBARs, shifts by about 0.6% of the center frequency over this temperature range. The upper edge of the pass band, which is defined by lithium niobate XBARs, shifts by about 1.4% of the center frequency over the same temperature range.

Figure 10:
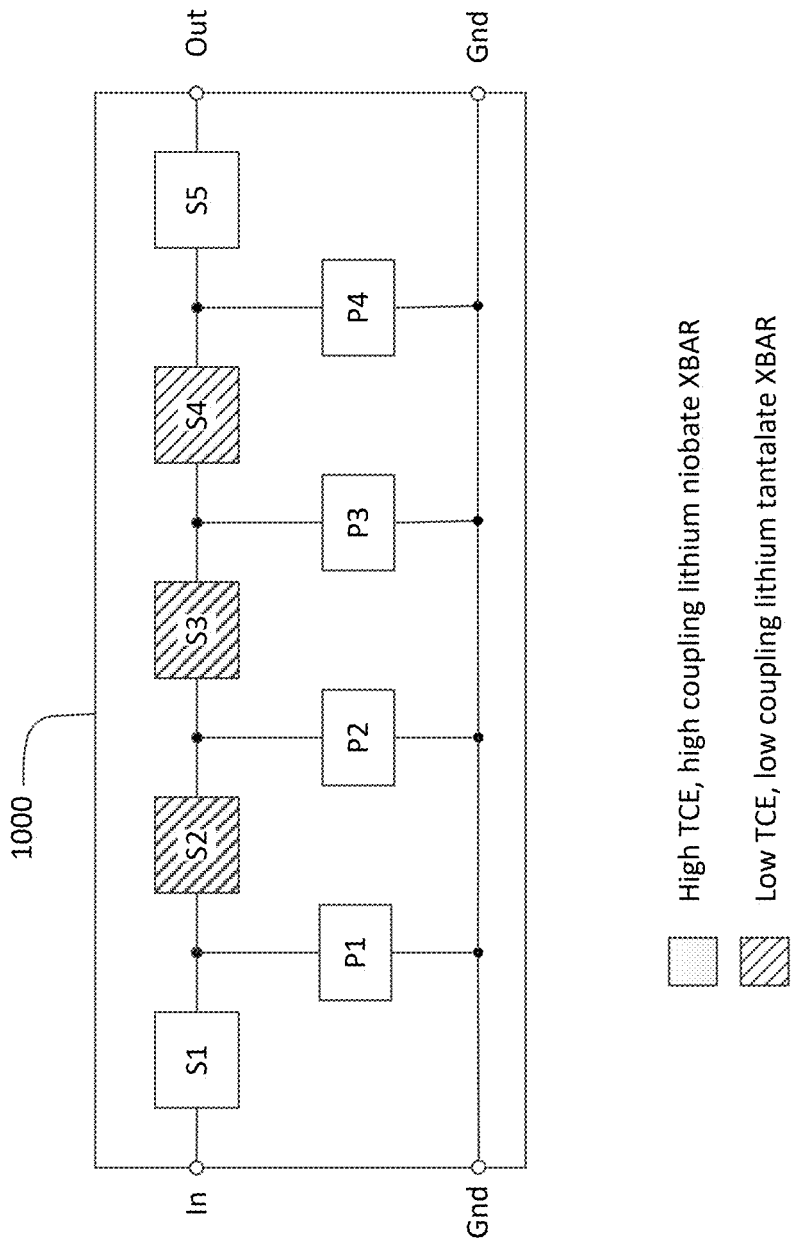
FIG. 10 is a schematic diagram of another filter using lithium niobate and lithium tantalate XBARs.

FIG. 10 is a schematic diagram of another bandpass filter 1000 that takes advantage of the features of both lithium niobate and lithium tantalate XBARs. The filter 1000 includes five series resonators S1, S2, S3, S4, and S5 and four shunt resonators P1, P2, P3, and P4. Series resonators S2, S3, and S4 are lithium tantalate XBARs. the other resonators are lithium niobate XBARs.

The input-output transfer function of the filter 1000 will be near zero at the anti-resonance frequencies of the series resonators. In other words, each series resonator creates a "transmission zero" at its anti-resonance frequency. At least one of the lithium tantalate series resonators S2, S3, S4 defines the upper edge of the passband of the filter by creating at least one transmission zeros immediately adjacent the upper edge of the filter passband. In some cases, two or more series resonators may create transmission zeros at the same frequency and jointly define the band edge. The TCF of the upper edge of the passband will be approximately equal to the TCF of the resonator that creates the immediately adjacent transmission zero. Since the band edge is defined by one or more of the lithium tantalate XBAR series resonators S2, S3, S4, the TCF of the upper edge of the passband will be about equal to the TCF of lithium tantalate. The benefit of using a lithium tantalate XBAR to define the upper edge of the passband is illustrated in FIG. 11.

Figure 11:
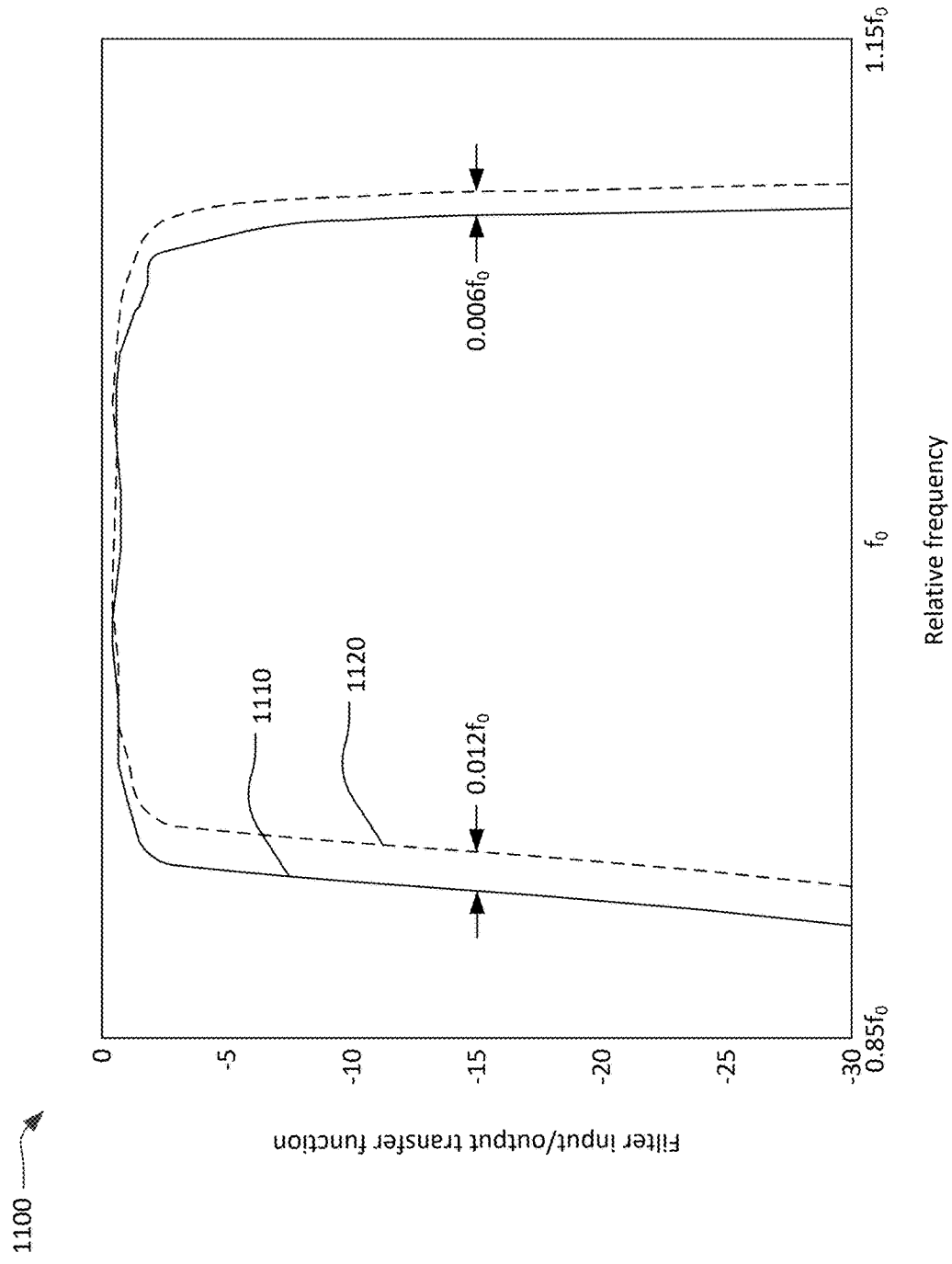
FIG. 11 is a graph of the input/output transfer function of the filter of FIG. 10 at two temperatures.

FIG. 11 is a graph 1100 of the input/output transfer function of the filter 1000 of FIG. 10 at two widely separated temperatures. Specifically, the solid curve 1110 is a plot of the input/output transfer function of the filter 1000 at a high temperature. The dashed curve 1120 is a plot of the input/output transfer function of the filter 1000 at a low temperature. The difference between the high and low temperatures is 128 degrees Celsius. The upper edge of the passband, which is defined by lithium tantalate XBARs, shifts by about 0.6% of the center frequency over this temperature range. The lower edge of the pass band, which is defined by lithium niobate XBARs, shifts by about 1.2% of the center frequency over the same temperature range.

Figure 12:
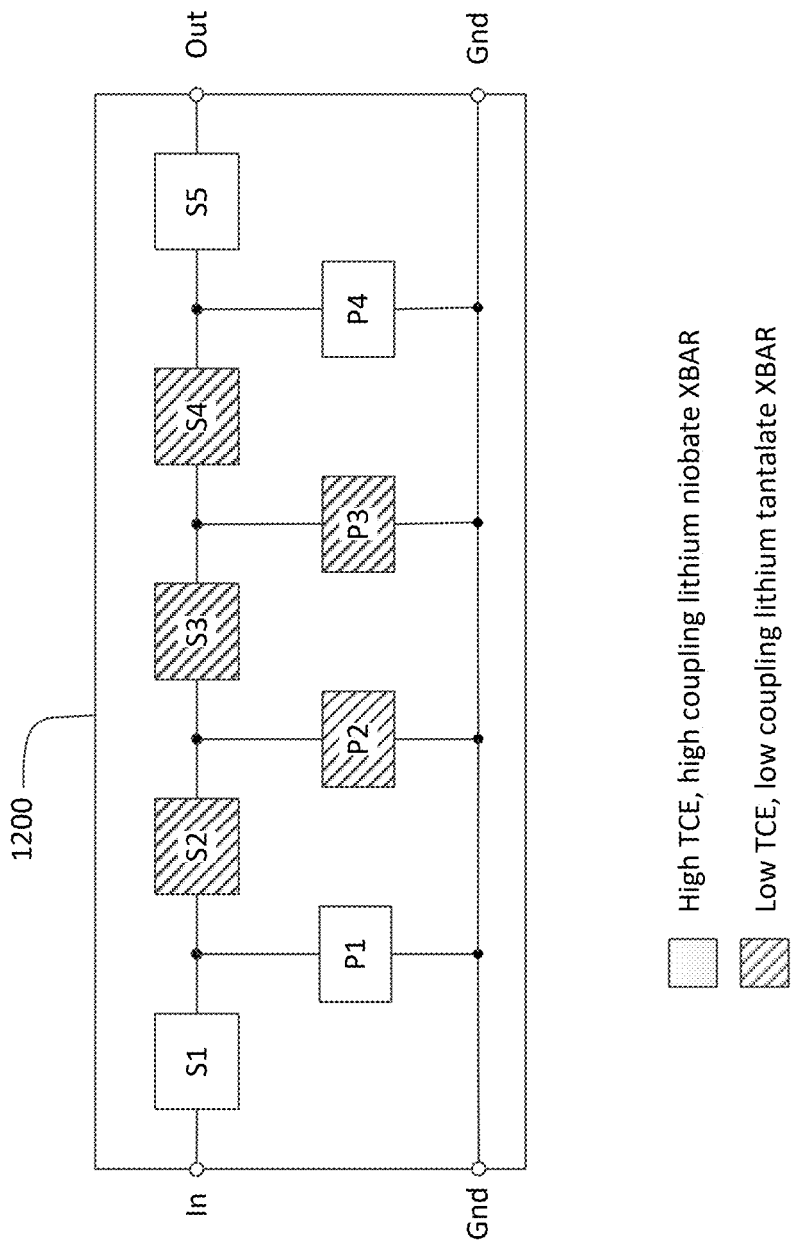
FIG. 12 is a schematic diagram of another filter using lithium niobate and lithium tantalate XBARs.

FIG. 12 is a schematic diagram of another bandpass filter 1200 that takes advantage of the features of both lithium niobate and lithium tantalate XBARs. The filter 1200 includes five series resonators S1, S2, S3, S4, and S5 and four shunt resonators P1, P2, P3, and P4. Shunt resonators P2 and P3 are lithium tantalate XBARs. Series resonators S2, S3, and S4 are also lithium tantalate XBARs. The other resonators S1, P1, P4, S5 are lithium niobate XBARs.

The lower band edge of the bandpass filter 1200 is defined by one or more of the lithium tantalate XBAR shunt resonators P2, P3. Thus, the change in the frequency of the lower band edge with temperature will be similar to that of the filter 700 as shown in FIG. 9. The upper band edge of the bandpass filter 1200 is defined by one or more of the lithium tantalate XBAR series resonators S2, S3, S4. Thus, the change in the frequency of the upper band edge with temperature will be similar to that of the filter 1000 as shown in FIG. 11.

The previous examples assumed the piezoelectric plater in the lithium tantalate XBARs was Z-cut with Euler angles of (0°, 0°, 90°). The TCF of the previous example filters may be further improved if the lithium tantalate XBARS use a rotated Y-cut piezoelectric plate with Euler angles (0°, β, 0°) where 0≤β.

Figure 13:
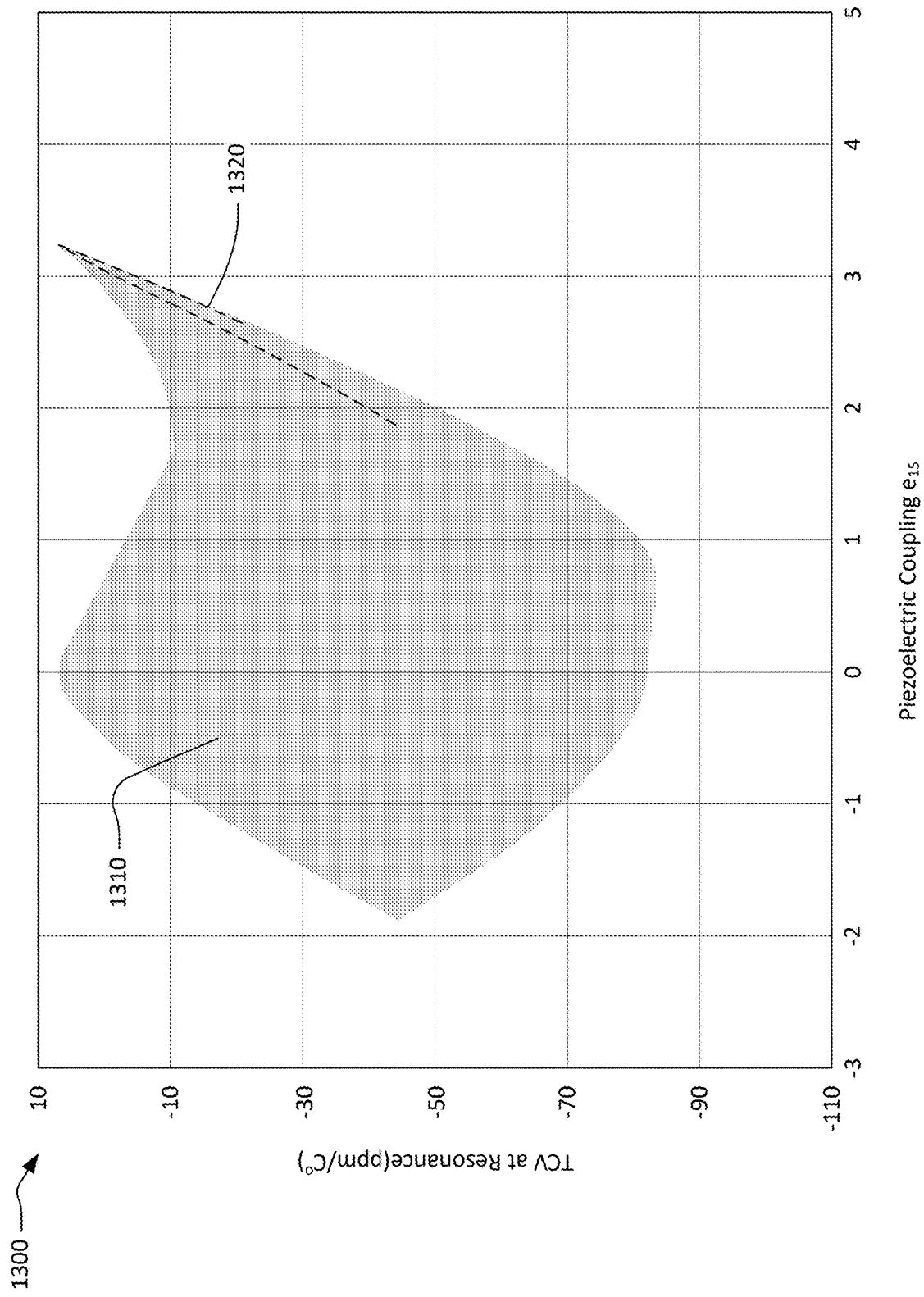
FIG. 13 is a graph of possible combinations of piezoelectric coupling and temperature coefficient of velocity for lithium tantalate.

FIG. 13 is a chart 1300 of possible combinations of piezoelectric coupling coefficient $e_{15}$ and temperature coefficient of shear mode velocity TCV for all possible orientations of a lithium tantalate crystal. TCV is the dominant, but not the only, factor that determines the TCF of an XBAR. The shaded area 1310 contains the values of $e_{15}$ and TCV for all possible combinations of angles α, β, and γ. The dashed line 1320 is the locus of (e15, TCV) values for lithium tantalate piezoelectric plates with Euler angles (0°, β, 0°) where 0≤β≤180°. FIG. 13 shows the maximum piezoelectric coupling coefficient for lithium tantalate is lower than the maximum for lithium niobate. However, lithium tantalate has a wider range of TCV values than lithium niobate. In particular, the TCV of a lithium tantalate piezoelectric plate can be selected within a wide range by selecting an appropriate value for the second Euler angle β.

Figure 14:
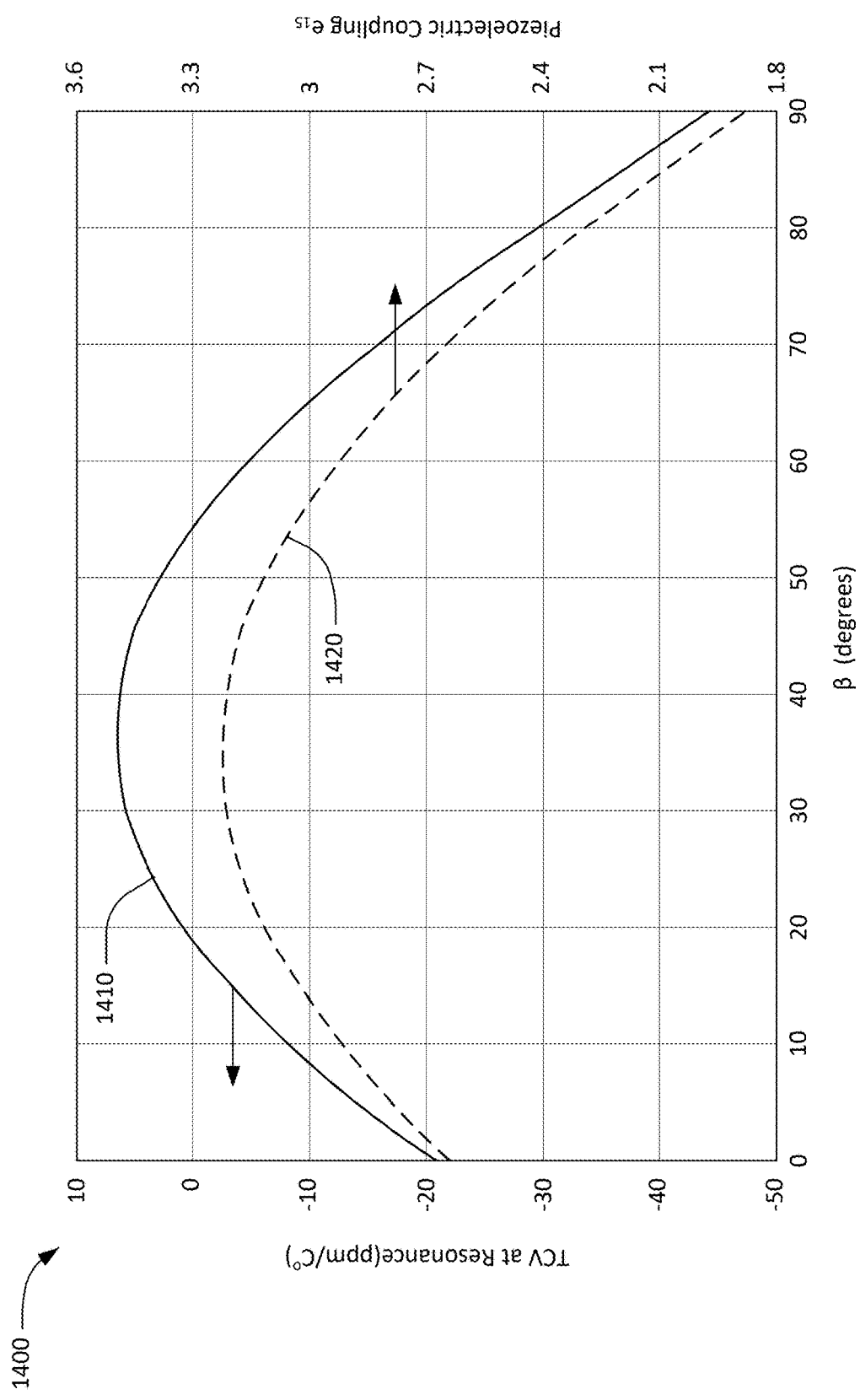
FIG. 14 is a graph of piezoelectric coupling and temperature coefficient of velocity as functions of Euler angle β for lithium tantalate.

FIG. 14 is a chart 1400 of piezoelectric coupling coefficient $e_{15}$ and temperature coefficient of velocity TCV as functions of Euler angle β for lithium tantalate with Euler angles (0°, β, 0°). Specifically, the solid curve 1410 is a plot of TCV versus β. The solid curve 1410 is read against the left-hand axis. TCV is expressed in part per million per degree Celsius (ppm/° C.). The dashed curve 1420 is a plot of $e_{15}$ versus temperature. The dashed curve 1420 is read against the right-hand axis.

Inspection of FIG. 14 shows that rotated Y-cut lithium tantalate with Euler angles (0°, β, 0°) has a small positive TCV and $e_{15}$ greater than 3.0 for β between about 18° and 54°. For comparison, Z-cut lithium tantalate has TCV equal to −20 ppm/° C. and $e_{15}$ equal to about 2.65. Both TCV and e15 are maximized for β between about 30° and 40°. By selecting the proper value of β within the range from 0° to about 40°, TCV of the lithium tantalate XBARs can be set to any values between −21 ppm to +7 ppm. Proper selection of β within this range may reduce, possibly to zero, the TCF of the band edges for any of the previously presented example filters.

FIG. 15A is an exemplary schematic plan view of a filter 1500, which has the same schematic diagram as the ladder filter 1200 of FIG. 12. Lithium tantalate XBARs P2, P3, S2, S3, and S4 are fabricated on a first chip 1510. The first chip 1510 includes a rotated Y-cut lithium tantalate piezoelectric plate with Euler angles (0°, β, 0°), 0°<β≤40°. Lithium niobate XBARs P1, P4, S1, and S5 are fabricated on a second chip 1520. The second chip 1520 includes a lithium tantalate piezoelectric plate that may be Z-cut, rotated Z-cut, rotated Y-cut, or some other orientation. Within each chip 1510, 1520, the XBARs are interconnected by conductors, such as conductor 1530, formed on the respective chip. The chips 1510, 1520 are electrically connected to each other and to a system external to the filter by means of pads, such as pad 1540. Each pad may, for example, be, or interface with, a solder or gold bump to connect with a circuit card (not shown).

Electrical connections 1550 between the lithium tantalate XBARs on the first chip 1510 and the lithium niobate XBARs on the second chip 1520 are shown as bold lines. The connections 1550 are made, for example, by conductors on a circuit card to which the first and second chips are mounted. In this context, the term "circuit card" means an essentially planar structure containing conductors to connect the first and second chips to each other and to a system external to the band-pass filter 1500. The circuit card may be, for example, a single-layer or multi-layer printed wiring board, a low temperature co-fired ceramic (LTCC) card, or some other type of circuit card. Traces on the circuit card can have very low resistance such that losses in the traces are negligible. The inductance of the electrical connections 1550 between the series and shunt resonators can be compensated in the design of the acoustic wave resonators. In some cases, the inductance of the electrical connections 1550 can be exploited to improve the performance of the filter, for example by lowering the resonance frequency of one or more shunt resonators to increase the filter bandwidth.

FIG. 15B is a schematic cross-sectional view of the bandpass filter 1500. The split ladder filter 1500 includes a first chip 1510 and a second chip 1520 attached to, and interconnected by, a circuit card 1560. In this example, the first and second chips 1510, 1520 are "flip-chip" mounted to the circuit card 1560. Electrical connections between the first and second chips, 1510, 1520 and the circuit card 1560 are made by solder or gold bumps, such as bump 1570. Electrical connections between the first chip 1510 and the second chip 1520 are made by conductors on or within the circuit card 1560. The first and second chips 1510, 1520 may be mounted on and/or connected to the circuit card 1560 in some other manner.

The filters 700, 1000, and 1200 are exemplary. A bandpass filter may have more or fewer than nine resonators, more or fewer than four shunt resonators, and more or fewer than five series resonators. A filter using both lithium tantalate XBARs and lithium niobate XBARs will have at least one lithium tantalate XBAR, which may be shunt resonator or a series resonator, and at least one lithium niobate XBAR, which may be shunt resonator or a series resonator. One or both of the upper band edge and the lower band edge may be defined by lithium tantalate XBARs.

Description of Methods

Figure 16:
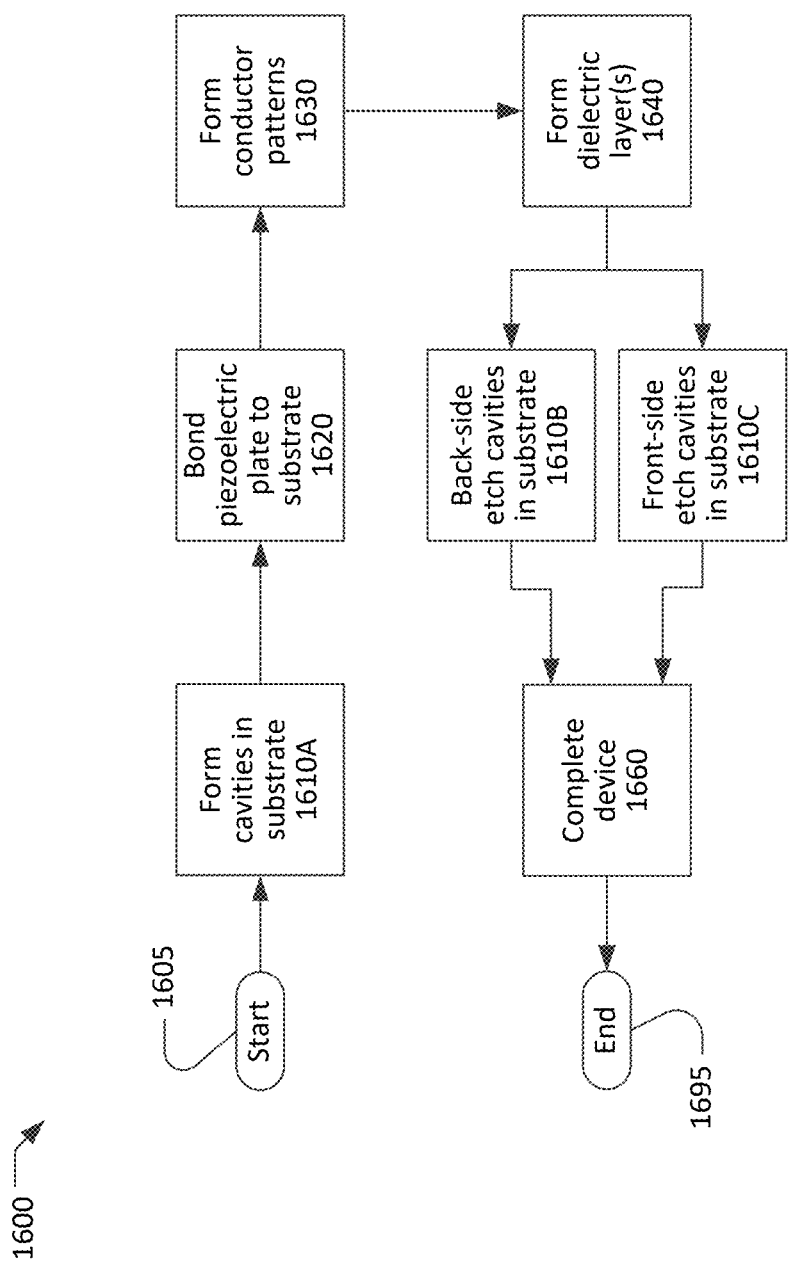
FIG. 16 is a flow chart of a process for fabricating XBARs.

FIG. 16 is a simplified flow chart showing a process 1600 for making an XBAR or a filter incorporating XBARs. The process 1600 starts at 1605 with a substrate and a plate of piezoelectric material and ends at 1695 with a completed XBAR or filter. The flow chart of FIG. 16 includes only major process steps. Various conventional process steps (e.g. surface preparation, cleaning, inspection, baking, annealing, monitoring, testing, etc.) may be performed before, between, after, and during the steps shown in FIG. 16.

The flow chart of FIG. 16 captures three variations of the process 1600 for making an XBAR which differ in when and how cavities are formed in the substrate. The cavities may be formed at steps 1610A, 1610B, or 1610C. Only one of these steps is performed in each of the three variations of the process 1600.

The piezoelectric plate may be lithium niobate or lithium tantalate. The piezoelectric plate may be Z-cut, rotated Z-cut, or rotated YX-cut, or some other cut. The substrate may preferably be silicon. The substrate may be some other material that allows formation of deep cavities by etching or other processing.

In one variation of the process 1600, one or more cavities are formed in the substrate at 1610A, before the piezoelectric plate is bonded to the substrate at 1620. A separate cavity may be formed for each resonator in a filter device. The one or more cavities may be formed using conventional photolithographic and etching techniques. Typically, the cavities formed at 1610A will not penetrate through the substrate, and the resulting resonator devices will have a cross-section as shown in FIG. 3.

At 1620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1630 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1630 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1630 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1640, a front-side dielectric layer or frequency setting dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 1600, one or more cavities are formed in the back side of the substrate at 1610B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In a third variation of the process 1600, one or more cavities in the form of recesses in the substrate may be formed at 1610C by etching the substrate using an etchant introduced through openings in the piezoelectric plate. A separate cavity may be formed for each resonator in a filter device. The one or more cavities formed at 1610C will not penetrate through the substrate, and the resulting resonator devices will have a cross-section as shown in FIG. 3.

In all variations of the process 1600, the filter device is completed at 1660. Actions that may occur at 1660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1660 is to tune the resonant frequencies of the resonators within the device by adding or removing metal or dielectric material from the front side of the device. After the filter device is completed, the process ends at 1695.

Figure 17:
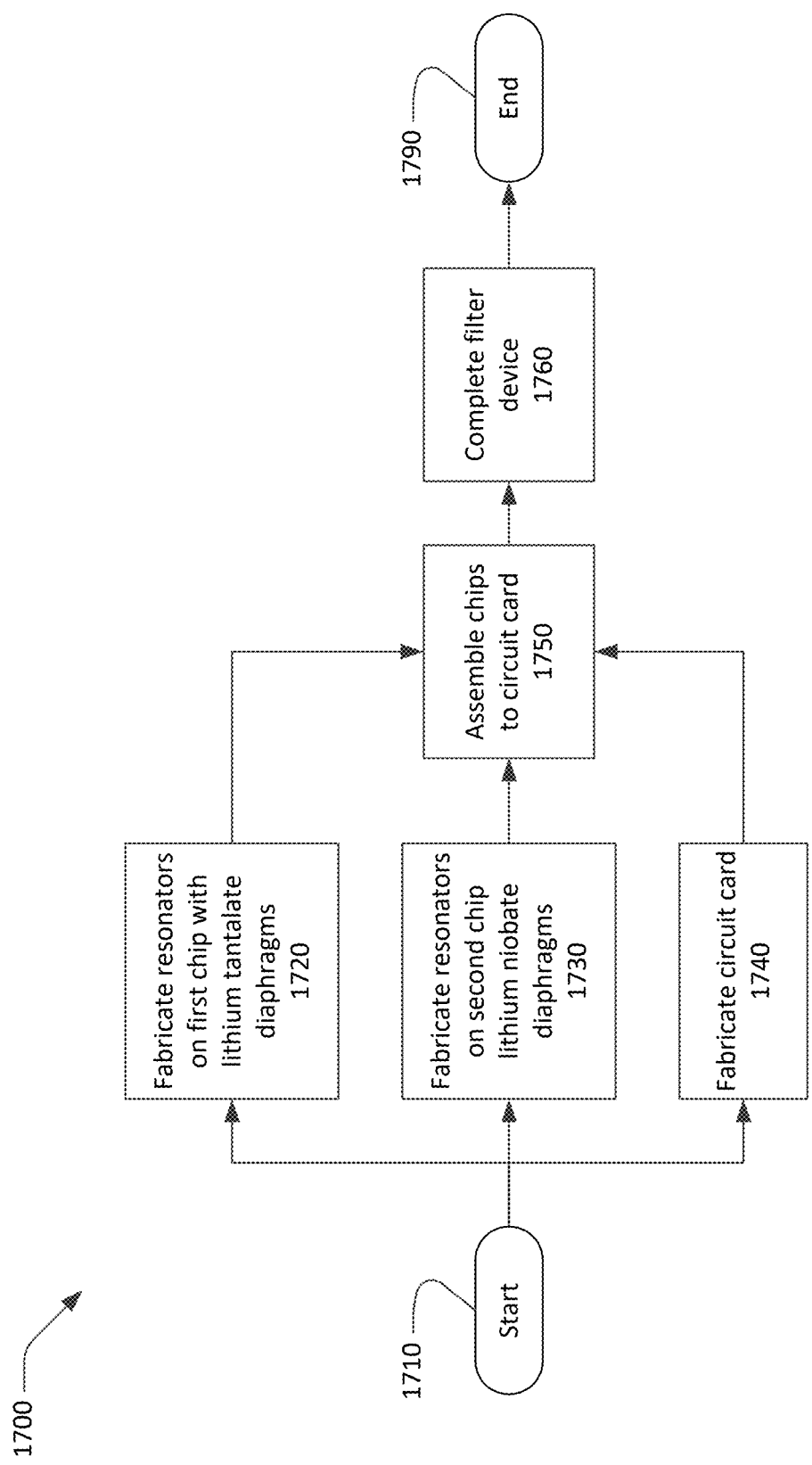
FIG. 17 is a flow chart of a process for fabricating a filter using lithium niobate and lithium tantalate XBARs.

FIG. 17 is a flow chart of a method 1700 for fabricating a filter using lithium niobate and lithium tantalate XBARs, which may be the filters 700, 1000, or 1200. The method 1700 starts at 1710 and concludes at 1790 with a completed filter device.

At 1720, a first chip containing one or more XBAR resonators with lithium tantalate diaphragms is fabricated. The first chip may be fabricated using the process 1700 with a lithium tantalate piezoelectric plate with Euler angles (0°, β, 0°), 0°<β≤40°. The first chip contains a subset of the resonators of the filter device, which may include series resonators and/or shunt resonators. The first chip may be a portion of a first large multi-chip wafer such that multiple copies of the first chip are produced during each repetition of the step 1720. In this case, individual chips may be excised from the wafer and tested as part of the action at 1720.

At 1730, a second chip containing one or more XBAR resonators with lithium niobate diaphragms is fabricated. The second chip may be fabricated using the process 1700 using a lithium niobate piezoelectric plate. The second chip contains a subset of the resonators of the filter device, which may include series resonators and/or shunt resonators. The second chip may be a portion of a second large multi-chip wafer such that multiple copies of the second chip are produced during each repetition of the step 1730. In this case, individual chips may be excised from the wafer and tested as part of the action at 1730.

At 1740, a circuit card is fabricated. The circuit card may be, for example, a printed wiring board or an LTCC card or some other form of circuit card. The circuit card may include one or more conductors for making at least one electrical connection between a resonator on the first chip and a resonator on the second chip. The circuit may be a portion of large substrate such that multiple copies of the circuit card are produced during each repetition of the step 1740. In this case, individual circuit cards may be excised from the substrate and tested as part of the action at 1740. Alternatively, individual circuit cards may be excised from the substrate after chips have been attached to the circuit cards at 1750, or after the devices are packaged at 1760.

At 1750, individual first and second chips are assembled to a circuit card (which may or may not be a portion of a larger substrate) using known processes. For example, the first and second chips may be "flip-chip" mounted to the circuit card using solder or gold bumps or balls to make electrical, mechanical, and thermal connections between the chips and the circuit card. The first and second chips may be assembled to the circuit card in some other manner.

The filter device is completed at 1760. Completing the filter device at 1760 includes packaging and testing. Completing the filter device at 1760 may include excising individual circuit card/chip assemblies from a larger substrate before or after packaging.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or"

means that the listed items are alternatives, but the alternatives also include any combination of the listed items.

It is claimed:

1. A bandpass filter having a passband between a lower band edge and an upper band edge, comprising:
   a plurality of transversely-excited film bulk acoustic resonators (XBARs) connected in a ladder filter circuit, wherein
   the plurality of XBARs includes at least one lithium tantalate (LT) XBAR and at least one lithium niobate (LN) XBAR, and
   each of the at least one LT XBAR comprises an LT piezoelectric layer with Euler angles (0°, β, 0°), where β is greater than zero and less than or equal to 40 degrees.

2. The bandpass filter of claim 1, wherein the lower band edge is defined by one or more LT XBARs from the plurality of XBARs.

3. The bandpass filter of claim 2, wherein the one or more LT XBARS are shunt resonators in the ladder filter circuit.

4. The filter of claim 1, wherein the upper band edge is defined by one or more LT XBARs from the plurality of XBARs.

5. The bandpass filter of claim 4, wherein the one or more LT XBARS are series resonators in the ladder filter circuit.

6. The bandpass filter of claim 1, wherein the lower band edge is defined by a first LT XBAR from the plurality of XBARs and the upper band edge is defined by a second LT XBAR from the plurality of XBARs.

7. The bandpass filter of claim 6, wherein the first LT XBAR is a shunt resonator in the ladder filter circuit and the second LT XBAR is a series resonator in the ladder filter circuit.

8. The bandpass filter of claim 1, wherein β is selected to minimize a temperature coefficient of frequency of at least one of the upper band edge and the lower band edge.

9. A bandpass filter having a passband between a lower band edge and an upper band edge, comprising:
   a circuit card;
   a first chip mounted on and connected to the circuit card, the first chip comprising one or more lithium tantalate (LT) transversely-excited film bulk acoustic resonators (XBARs), each of the one or more LT XBARs comprising an LT layer with Euler angles (0°, β, 0°), where β is greater than zero and less than or equal to 40 degrees; and
   a second chip mounted on and connected to the circuit card, the second chip comprising one or more lithium niobate (LN) XBARs, wherein
   the one or more LT XBARs and the one or more LN XBARs are connected to form a ladder filter circuit.

10. The bandpass filter of claim 9, wherein the first chip comprises:
    a first substrate having a surface;
    the LT layer, a back surface of the LT layer attached to the surface of the first substrate, portions of the LT layer forming one or more LT diaphragms over cavities in the first substrate; and
    a first conductor pattern at a surface of the LT layer, the first conductor pattern including a respective interdigital transducer (IDT) of each of the one or more LT XBARs, interleaved fingers of each IDT disposed on a respective one of the one or more LT diaphragms.

11. The bandpass filter of claim 9, wherein the second chip comprises:
    a second substrate having a surface;
    an LN layer, a back surface of the LN layer attached to the surface of the second substrate, portions of the LN layer forming one or more LN diaphragms over cavities in the second substrate; and
    a second conductor pattern at a surface of the LN layer, the second conductor pattern including a respective interdigital transducer (IDT) of each of the one or more LN XBARs, interleaved fingers of each IDT disposed on a respective one of the one of more LN diaphragms.

12. The bandpass filter of claim 9, wherein the lower band edge is defined by a first LT XBAR of the one or more LT XBARs.

13. The bandpass filter of claim 12, wherein the first LT XBAR is a shunt resonator in the ladder filter circuit.

14. The bandpass filter of claim 9, wherein the upper band edge is defined by a first LT XBAR of the one or more LT XBARs.

15. The bandpass filter of claim 14, wherein the first LT XBAR is a series resonator in the ladder filter circuit.

16. The bandpass filter circuit of claim 9, wherein
    the one or more LT XBARs is at least two LT XBARs,
    the lower band edge is defined by a first LT XBAR of the at least two LT XBARs, and
    the upper band edge is defined by a second LT XBAR of the at least two LT XBARs.

17. The bandpass filter of claim 16, wherein the first LT XBAR is a shunt resonator in the ladder filter circuit and the second LT XBAR is a series resonator in the ladder filter circuit.

18. The bandpass filter of claim 9, the circuit card comprising:
    at least one conductor connecting an LT XBAR of the one or more LT XBARs of the first chip to an LN XBAR of the one or more LN XBARs of the second chip.

19. The bandpass filter of claim 9, wherein β is selected to minimize a temperature coefficient of frequency of at least one of the upper band edge and the slower band edge.

20. A method for fabricating a filter, comprising:
    fabricating a first chip containing one or more lithium tantalate (LT) transversely-excited film bulk acoustic resonators (XBARs), each of the one or more LT XBARs comprising an LT piezoelectric layer with Euler angles (0°, β, 0°), where β is greater than zero and less than or equal to 40 degrees;
    fabricating a second chip containing one or more lithium niobate (LN) XBARs; and
    connecting the first chip and the second chip to a circuit card,
    wherein the circuit card comprises at least one conductor for connecting an LT XBAR of the one or more LT XBARs of the first chip to an LN XBAR of the one or more LN XBARs of the second chip.

* * * * *